US010032823B2

(12) United States Patent
Kato et al.

(10) Patent No.: US 10,032,823 B2
(45) Date of Patent: Jul. 24, 2018

(54) SOLID-STATE IMAGING DEVICE AND IMAGING APPARATUS

(71) Applicant: OLYMPUS CORPORATION, Hachioji-shi, Tokyo (JP)

(72) Inventors: Shuichi Kato, Tokyo (JP); Yusuke Yamamoto, Kawasaki (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/404,431

(22) Filed: Jan. 12, 2017

(65) Prior Publication Data

US 2017/0125476 A1   May 4, 2017

Related U.S. Application Data

(63) Continuation of application No. PCT/JP2015/060354, filed on Apr. 1, 2015.

(30) Foreign Application Priority Data

Jul. 17, 2014   (JP) ................................. 2014-146861

(51) Int. Cl.
*H01L 31/0232*   (2014.01)
*H01L 27/146*   (2006.01)
(Continued)

(52) U.S. Cl.
CPC .......... *H01L 27/14645* (2013.01); *G02B 7/28* (2013.01); *G02B 7/34* (2013.01);
(Continued)

(58) Field of Classification Search
CPC ......... H01L 27/14645; H01L 27/14627; H01L 27/1464; H01L 27/1461; H01L 27/14623;
(Continued)

(56) References Cited

U.S. PATENT DOCUMENTS

2007/0154200 A1   7/2007 Utagawa et al.
2013/0235237 A1\*  9/2013 Aoki ................. H01L 27/14625
                                                                    348/294
2014/0042577 A1   2/2014 Aoki

FOREIGN PATENT DOCUMENTS

JP   2007-184716 A   7/2007
JP   2010-160314 A   7/2010
(Continued)

OTHER PUBLICATIONS

International Search Report dated Jun. 16, 2015 issued in counterpart application No. PCT/JP2015/060354, w/ English translation. (4 pages).

*Primary Examiner* — Vu A Vu
(74) *Attorney, Agent, or Firm* — Westerman, Hattori, Daniels & Adrian, LLP

(57) ABSTRACT

A solid-state imaging device includes: a first substrate having first photoelectric converters; a second substrate having second photoelectric converters and laminated on the first substrate; micro lenses disposed on an opposite face facing an imaging lens among faces of the second substrate and which forms an image of light passing through the imaging lens; and a light shielding layer disposed between the first and second photoelectric converters. The light shielding layer includes: a selection portion provided with an opening portion which selectively allows passage of only light passing through a partial region of a pupil region in an exit pupil of the imaging lens among light passing through the micro lens and transmitted through the second photoelectric converter; and a light shielding portion which shields an entire light passing through the micro lens and transmitted through the second photoelectric converter.

10 Claims, 7 Drawing Sheets

(51) Int. Cl.
*G02B 7/28* (2006.01)
*G02B 7/34* (2006.01)
*G03B 13/36* (2006.01)
*H04N 5/369* (2011.01)
*H04N 5/225* (2006.01)
*H04N 9/04* (2006.01)

(52) U.S. Cl.
CPC .......... *G03B 13/36* (2013.01); *H01L 27/1461* (2013.01); *H01L 27/1464* (2013.01); *H01L 27/14621* (2013.01); *H01L 27/14623* (2013.01); *H01L 27/14627* (2013.01); *H01L 27/14634* (2013.01); *H01L 27/14636* (2013.01); *H04N 5/2254* (2013.01); *H04N 5/369* (2013.01); *H04N 5/3696* (2013.01); *H04N 9/045* (2013.01)

(58) Field of Classification Search
CPC ......... H01L 27/14634; H01L 27/14636; H01L 27/14621; H04N 5/3696; H04N 5/2254; H04N 9/045; H04N 5/369; G02B 7/34; G02B 7/28; G03B 13/36
USPC .......................................................... 257/432
See application file for complete search history.

(56) References Cited

FOREIGN PATENT DOCUMENTS

| | | |
|---|---|---|
| JP | 2011-530165 A | 12/2011 |
| JP | 2013-187475 A | 9/2013 |
| JP | 2014-39078 A | 2/2014 |
| WO | 2010/014138 A1 | 2/2010 |
| WO | 2014/017314 A1 | 1/2014 |

* cited by examiner

SOLID-STATE IMAGING DEVICE AND IMAGING APPARATUS

CROSS REFERENCE TO RELATED APPLICATIONS

This application is a continuation application based on a PCT Patent Application No. PCT/JP2015/060354, filed on Apr. 1, 2015, whose priority is claimed on Japanese Patent Application No. 2014-146861, filed Jul. 17, 2014, the entire content of which are hereby incorporated by reference.

BACKGROUND OF THE INVENTION

Field of the Invention

The present invention relates to a solid-state imaging device and an imaging apparatus with a structure obtained by laminating a plurality of substrates.

Description of the Related Art

For example, as disclosed in Japanese Unexamined Patent Application, First Publication No. 2010-160314, a solid-state imaging device having a focal plane phase detection function (an AF function) is formed such that a photoelectric converter for obtaining an imaging signal and a photoelectric converter for obtaining a focus detection signal are formed in the same substrate. In this structure, since the number of the photoelectric converters for obtaining the imaging signal is limited, a resolution of a captured image is deteriorated.

Meanwhile, Japanese Unexamined Patent Application, First Publication No. 2013-187475 discloses a structure in which a substrate including a photoelectric converter for obtaining an imaging signal and a substrate including a photoelectric converter for obtaining a focus detection signal are laminated. In this structure, since the photoelectric converter for obtaining the focus detection signal does not limit the number of the photoelectric converters for obtaining the imaging signal, deterioration in resolution of a captured image can be prevented.

SUMMARY

A solid-state imaging device according to a first aspect of the present invention includes: a first substrate which includes a plurality of first photoelectric converters arranged two-dimensionally; a second substrate which includes a plurality of second photoelectric converters arranged two-dimensionally and is laminated on the first substrate; a plurality of micro lenses which are disposed on an opposite face facing an imaging lens among faces of the second substrate and form an image of light passing through the imaging lens; and a light shielding layer which is disposed between the first photoelectric converter and the second photoelectric converter and includes a selection portion provided with an opening portion for selectively allowing passage of only light passing through a partial region of a pupil region in an exit pupil of the imaging lens among light passing through the micro lens and transmitted through the second photoelectric converter and a light shielding portion for shielding the entire light passing through the micro lens and transmitted through the second photoelectric converter. Here, each of the plurality of first photoelectric converters overlaps a micro lens group including a plurality of micro lenses among the plurality of micro lenses when the opposite face of the second substrate is viewed in a normal direction, the selection portion corresponding to the micro lens group selectively allows passage of only light passing through the same region in a part of the pupil region, and the light shielding portion corresponding to the micro lens group is disposed to correspond to at least a part of the micro lens disposed at a farthest end in a direction of a gravity center position of the opening portion formed on the selection portion relative to a center position of the micro lens corresponding to the selection portion among the micro lenses included in the micro lens group.

According to the solid-state imaging device of a second aspect of the present invention, in the solid-state imaging device of the first aspect, the light shielding portion corresponding to the micro lens group may be disposed to correspond to the entire micro lens disposed at the farthest end in the positional displacement direction among the micro lenses included in the micro lens group.

According to the solid-state imaging device of a third aspect of the present invention, in the solid-state imaging device of the first aspect, a plurality of color filters arranged two-dimensionally may be disposed between the plurality of micro lenses and the plurality of second photoelectric converters, each of the plurality of color filters may be disposed to correspond to the micro lens, an array of the plurality of color filters may be a Bayer array, the micro lens group may be disposed to correspond to a first column only having the green and blue filters disposed in the array of the plurality of color filters and a second column only having the red and green filters disposed in the array of the plurality of color filters, and the light shielding portion corresponding to the micro lens group may be disposed to correspond to the micro lens corresponding to the first column among the micro lenses included in the micro lens group.

According to the solid-state imaging device of a fourth aspect of the present invention, in the solid-state imaging device of the third aspect, the light shielding layer may include a plurality of the selection portions, the plurality of selection portions may include a first selection portion in which the direction of the gravity center position of the opening portion with respect to the center position of the micro lens is a first direction and a second selection portion in which the direction of the gravity center position of the opening portion with respect to the center position of the micro lens is a second direction opposite to the first direction, only the first selection portion of the first selection portion and the second selection portion may correspond to a first row of the array of the plurality of color filters, and only the second selection portion of the first selection portion and the second selection portion may correspond to a second row different from the first row in the array of the plurality of color filters.

According to the solid-state imaging device of a fifth aspect of the present invention, in the solid-state imaging device of the first aspect, a plurality of color filters arranged two-dimensionally may be disposed between the plurality of micro lenses and the plurality of first photoelectric converters, each of the plurality of color filters may be disposed to correspond to the micro lens, a period in the positional displacement direction of the array of the plurality of color filters may include n (n: an even number equal to or larger than 2) columns, the micro lens group may include the micro lenses disposed in n×m (m: a natural number equal to or larger than 2) columns arranged in the positional displacement direction, and the light shielding portion corresponding to the micro lens group may be disposed to correspond to the micro lenses disposed in an area from the column of a farthest end to a (n/2)-th column in the positional displacement direction and the micro lenses disposed in an area from the column of a farthest end to a (n/2)-th column in the opposite direction to the positional displacement direction among the micro lenses included in the micro lens group.

According to the solid-state imaging device of a sixth aspect of the present invention, in the solid-state imaging device of the first aspect, a plurality of color filters arranged two-dimensionally may be disposed between the plurality of micro lenses and the plurality of first photoelectric converters, each of the plurality of color filters may be disposed to correspond to the micro lens, a period in the positional displacement direction of the array of the color filters may include r (r: a natural number equal to or larger than 1) columns, the micro lens group may include the micro lenses disposed in r×s (s: a natural number equal to or larger than 2) columns arranged in the positional displacement direction, and the light shielding portion corresponding to the micro lens group may be disposed to correspond to only the micro lenses disposed in an area from the column of a farthest end to a (r×t)-th (t: a natural number equal to or larger than 1, s>t) column in the positional displacement direction among the micro lenses included in the micro lens group.

According to the solid-state imaging device of a seventh aspect of the present invention, in the solid-state imaging device of the first aspect, a back side illumination type image sensor may be used in the second substrate and a front side illumination type image sensor may be used in the first substrate.

According to the solid-state imaging device of an eighth aspect of the present invention, in the solid-state imaging device of the first aspect, a back side illumination type image sensor may be used in the first substrate and the second substrate and a thickness of the first photoelectric converter may be larger than a thickness of the second photoelectric converter in a lamination direction for the first substrate and the second substrate.

According to the solid-state imaging device of a ninth aspect of the present invention, in the solid-state imaging device of the first aspect, the light shielding layer may be disposed between a face of the first substrate side and the opposite face, in the second substrate.

An imaging apparatus according to a tenth aspect of the present invention may include the above solid-state imaging device.

DETAILED DESCRIPTION OF THE PREFERRED EMBODIMENTS

The present invention will be now described herein with reference to illustrative embodiments. Those skilled in the art will recognize that many alternative embodiments can be accomplished using the teaching of the present invention and that the present invention is not limited to the embodiments illustrated herein for explanatory purposes.

(First Embodiment)

Figure 1:
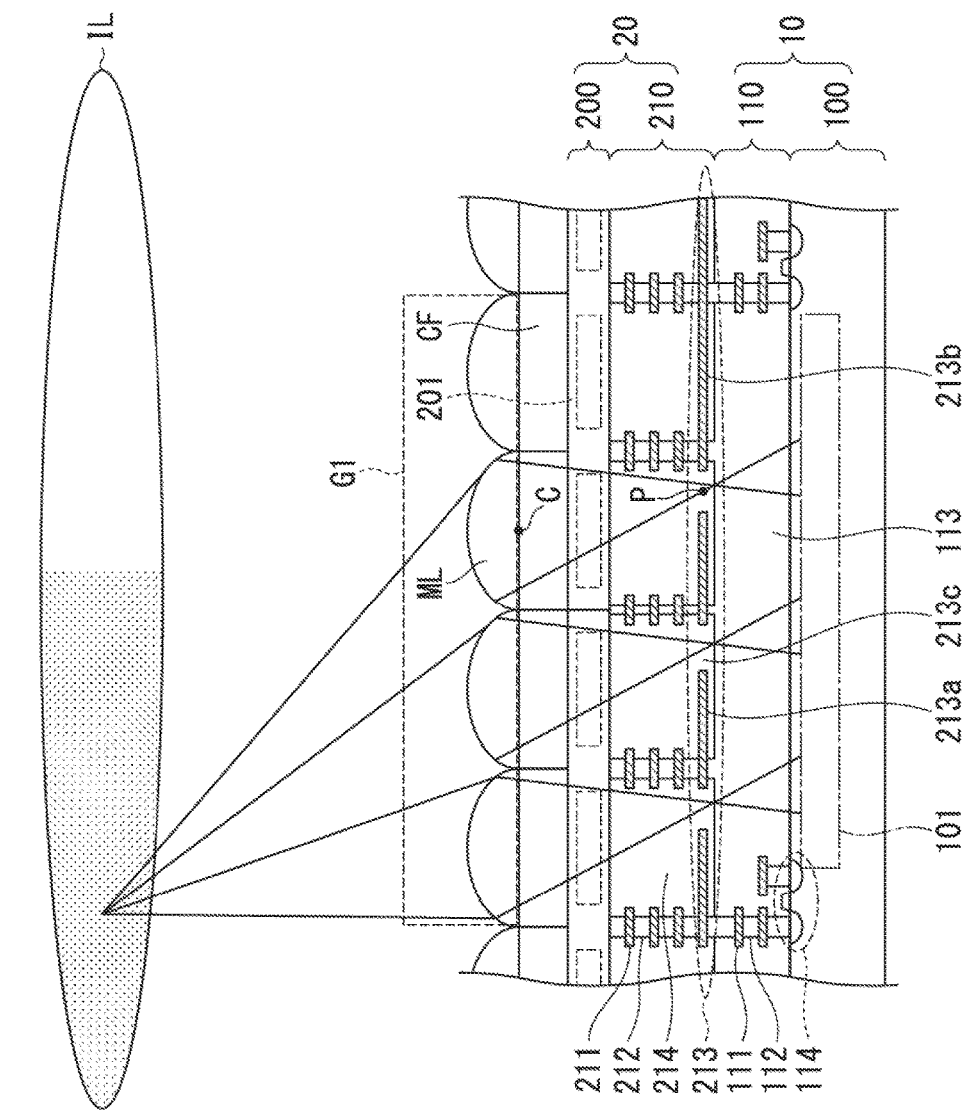
FIG. 1 is a cross-sectional view showing a configuration of a solid-state imaging device according to a first embodiment of the present invention.

First, a first embodiment of the present invention will be described. FIG. 1 shows a configuration of a solid-state imaging device 1a according to the embodiment. FIG. 1 shows a cross-section of the solid-state imaging device 1a. As shown in FIG. 1, the solid-state imaging device 1a includes a first substrate 10, a second substrate 20 which is laminated on the first substrate 10, a micro lens ML which is formed on a front face of the second substrate 20, and a color filter CF.

A dimension of a portion forming the solid-state imaging device 1a shown in FIG. 1 does not have to follow a dimension shown in FIG. 1. The dimension of the portion forming the solid-state imaging device 1a shown in FIG. 1 may be set arbitrarily.

The color filter CF is formed on a principal face of the second substrate 20 (a widest face among a plurality of faces forming the front face of the substrate) and the micro lens ML is formed on the color filter CF.

In FIG. 1, a plurality of micro lenses ML exist, but one micro lens ML is representatively indicated by a symbol. Further, in FIG. 1, a plurality of the color filters CF exist, but one color filter CF is representatively indicated by a symbol.

The micro lens ML is disposed on the principal face of an imaging lens IL side of the principal face of the second substrate 20. The micro lens ML forms an image of light passing through the imaging lens IL. The color filter CF causes light of a wavelength corresponding to a predetermined color to be transmitted therethrough. For example, red, green, and blue filters CF are disposed to form a two-dimensional Bayer array.

The first substrate 10 includes a first semiconductor layer 100 and a first wiring layer 110. The first semiconductor layer 100 and the first wiring layer 110 are laminated in a direction crossing the principal face of the first substrate 10 (for example, a direction substantially perpendicular to the principal face).

The first semiconductor layer 100 includes a first photoelectric converter 101. In FIG. 1, a plurality of the first photoelectric converters 101 exist, but one first photoelectric converter 101 is representatively indicated by a symbol. The first semiconductor layer 100 is formed of a material including a semiconductor such as silicon (Si). The first semiconductor layer 100 includes a first face which faces the first wiring layer 110 and a second face which is opposite to the first face. The second face of the first semiconductor layer 100 forms one principal face of the first substrate 10. Light which is incident to the first face of the first semiconductor layer 100 advances inside the first semiconductor layer 100 so that the light is incident to the first photoelectric converter 101. The first photoelectric converter 101 is formed of, for example, a semiconductor material having an impurity concentration different from that of the semiconductor material forming the first semiconductor layer 100. The first photoelectric converter 101 converts the incident light into a signal. That is, the first photoelectric converter 101 generates a focus detection signal based on a phase difference detection method.

The first wiring layer 110 includes a first wire 111, a first via 112, a first interlayer insulation film 113, and a MOS transistor 114. In FIG. 1, a plurality of the first wires 111 exist, but one first wire 111 is representatively indicated by a symbol. Further, in FIG. 1, a plurality of the first vias 112 exist, but one first via 112 is representatively indicated by a symbol. Further, in FIG. 1, a plurality of the MOS transistors 114 exist, but one MOS transistor 114 is representatively indicated by a symbol.

The first wire 111 is formed of a conductive material (for example, a metal such as aluminum (Al) or copper (Cu)). The first wiring layer 110 includes a first face which faces the second substrate 20 and a second face which is opposite to the first face and faces the first semiconductor layer 100. The first face of the first wiring layer 110 forms one principal face of the first substrate 10.

The first wire 111 is a thin film having a wiring pattern formed thereon. The first wire 111 transmits a focus detection signal generated by the first photoelectric converter 101, an imaging signal generated by a second photoelectric converter 201 of the second substrate 20, and the other signals (a power supply voltage, a ground voltage, and the like). The first wiring layer 110 may be provided with only one layer of the first wire 111 or a plurality of layers of the first wire 111. In the example shown in FIG. 1, the first wiring layer 110 is provided with two layers of the first wire 111.

The first via 112 is formed of a conductive material. The first via 112 connects the first wires 111 of different layers. In the first wiring layer 110, a portion other than the first wire 111 and the first via 112 is constituted of the first interlayer insulation film 113 formed of, for example, silicon dioxide (SiO$_2$) or the like.

The MOS transistor 114 includes a source region and a drain region which are diffusion regions formed in the first semiconductor layer 100 and a gate electrode which is formed in the first wiring layer 110.

The source region and the drain region are connected to the first via 112. The gate electrode is disposed between the source region and the drain region. The MOS transistor 114 processes the signal transmitted by the first wire 111 and the first via 112.

The first substrate 10 with the above-described structure constitutes a front side illumination (FSI) type image sensor.

The second substrate 20 includes a second semiconductor layer 200 and a second wiring layer 210. The second semiconductor layer 200 and the second wiring layer 210 are laminated in a direction crossing the principal face of the second substrate 20 (for example, a direction substantially perpendicular to the principal face).

The second semiconductor layer 200 includes the second photoelectric converter 201. In FIG. 1, a plurality of the second photoelectric converters 201 exist, but one second photoelectric converter 201 is representatively indicated by a symbol. The second semiconductor layer 200 is formed of a material including a semiconductor such as silicon (Si). The second photoelectric converter 201 is formed of, for example, a semiconductor material having an impurity concentration different from that of the semiconductor material forming the second semiconductor layer 200. The second semiconductor layer 200 includes a first face which faces the second wiring layer 210 and a second face which is opposite to the first face and faces the color filter CF. The second face of the second semiconductor layer 200 forms one principal face of the second substrate 20. Light which is incident to the second face of the second semiconductor layer 200 advances inside the second semiconductor layer 200 so that the light is incident to the second photoelectric converter 201. The second photoelectric converter 201 converts the incident light into a signal. That is, the second photoelectric converter 201 generates an imaging signal.

The second wiring layer 210 includes a second wire 211, a second via 212, a light shielding layer 213, and a second interlayer insulation film 214. In FIG. 1, a plurality of the second wires 211 exist, but one second wire 211 is representatively indicated by a symbol. Further, in FIG. 1, a plurality of the second vias 212 exist, but one second via 212 is representatively indicated by a symbol.

The second wire 211 is formed of a conductive material (for example, a metal such as aluminum (Al) or copper (Cu)). The second wiring layer 210 includes a first face which faces the first substrate 10 and a second face which is opposite to the first face and faces the second semiconductor layer 200. The first face of the second wiring layer 210 forms one principal face of the second substrate 20.

The second wire 211 is a thin film having a wiring pattern. The second wire 211 transmits an imaging signal generated by the first photoelectric converter 101 and the other signals (a power supply voltage, a ground voltage, and the like). The second wiring layer 210 may be provided with only one layer of the second wire 211 or a plurality of layers of the second wire 211. In the example shown in FIG. 1, the second wiring layer 210 is provided with three layers of the second wire 211.

The second via 212 is formed of a conductive material. The second via 212 connects the second wires 211 of different layers.

The light shielding layer 213 will be described below. In the second wiring layer 210, a portion other than the second wire 211, the second via 212, and the light shielding layer 213 is constituted of the second interlayer insulation film 214 formed of, for example, silicon dioxide (SiO$_2$) or the like.

The second substrate 20 with the above-described structure constitutes a back side illumination (BSI) type image sensor.

The first substrate 10 and the second substrate 20 are connected to each other while the first wiring layer 110 of the first substrate 10 faces the second wiring layer 210 of the second substrate 20. The first via 112 of the first wiring layer 110 and the second via 212 of the second wiring layer 210 are electrically connected to each other at a boundary face between the first substrate 10 and the second substrate 20.

The second substrate 20 includes the plurality of second photoelectric converters 201. When the imaging lens IL side principal face (the second face of the second semiconductor layer 200) among two principal faces of the second substrate 20 is viewed in the perpendicular direction, that is, the second substrate 20 is viewed in a plane, the plurality of second photoelectric converters 201 are two-dimensionally disposed.

The plurality of color filters CF are disposed between the plurality of micro lenses ML and the plurality of second photoelectric converters 201. The plurality of color filters CF are disposed to respectively correspond to the micro lenses ML. Light passing through the micro lens ML is incident to the color filter CF which is disposed at a position corresponding to the micro lens ML.

Each of the plurality of second photoelectric converters 201 is disposed to correspond to the micro lens ML and the color filter CF. Light passing through the micro lens ML and the color filter CF is incident to the second photoelectric converter 201 disposed at a position corresponding to the micro lens ML and the color filter CF.

The first substrate 10 includes the plurality of first photoelectric converters 101. When the principal face near the second substrate 20 (the first face of the first wiring layer 110) among two principal faces of the first substrate 10 are viewed in the perpendicular direction, that is, the first substrate 10 is viewed in a plane, the plurality of first photoelectric converters 101 are two-dimensionally disposed.

The plurality of first photoelectric converters 101 are disposed to respectively correspond to the plurality of second photoelectric converters 201. Light transmitted through the plurality of second photoelectric converters 201 is incident to the first photoelectric converters 101 disposed at positions respectively corresponding to the plurality of second photoelectric converters 201.

Further, each of the plurality of first photoelectric converters 101 is disposed to correspond to a micro lens group G1 including a plurality of micro lenses among the plurality of micro lenses ML. In FIG. 1, one first photoelectric converter 101 and one micro lens group G1 corresponding to the first photoelectric converter 101 are shown. Light transmitted through the plurality of micro lenses ML included in the micro lens group G1 is incident to the same first photoelectric converter 101.

The light shielding layer 213 is disposed between the first photoelectric converter 101 and the second photoelectric converter 201. In the embodiment, the light shielding layer 213 is disposed between the imaging lens IL side principal face and the first substrate 10 side principal face in the second substrate 20 among two principal faces of the second substrate 20. That is, the light shielding layer 213 is disposed between the second face of the second semiconductor layer 200 and the first face of the second wiring layer 210 in the second substrate 20. In FIG. 1, the light shielding layer 213 is disposed between the first face and the second face of the second wiring layer 210 in the second wiring layer 210. The light shielding layer 213 is formed of a light shielding material (for example, a metal such as aluminum (Al) or copper (Cu)).

The light shielding layer 213 is disposed at a position (an image forming position) where an image of light is formed by the micro lens ML in a direction perpendicular to the principal face of the imaging lens IL side (the second face of the second semiconductor layer 200) among two principal faces of the second substrate 20. The light shielding layer 213 includes a selection portion 213a and a light shielding portion 213b. A part of the selection portion 213a is opened so that an opening portion 213c is formed.

Figure 2A:
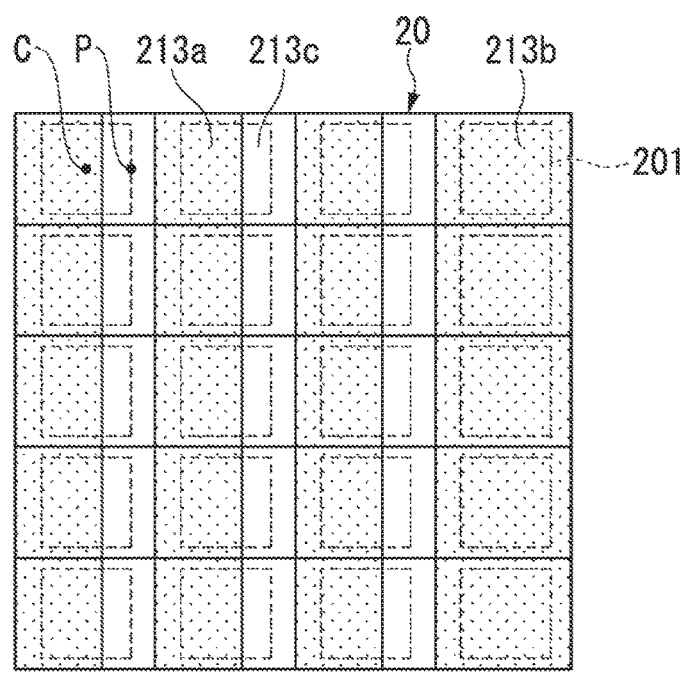
FIG. 2A is a top view showing a first substrate and a second substrate constituting the solid-state imaging device according to the first embodiment of the present invention.

The selection portion 213a and the opening portion 213c are disposed to correspond to the micro lens ML included in the micro lens group G1. The opening portion 213c is formed at a position corresponding to a partial region of a pupil region in an exit pupil of the imaging lens IL among the light passing through the micro lens ML and transmitted through the second photoelectric converter 201. When the second substrate 20 is viewed in a plane, as shown in FIG. 2A, a gravity center position P of the opening portion 213c is displaced relative to a center position C of the micro lens ML corresponding to the selection portion 213a in a predetermined direction. In FIG. 1, the gravity center position P of the opening portion 213c is displaced to the right relative to the center position C of the micro lens ML corresponding to the selection portion 213a.

Since the opening portion 213c is formed, the selection portion 213a selectively allows the passage of only the light passing through a partial region of the pupil region in the exit pupil of the imaging lens IL among the light passing through the micro lens ML and transmitted through the second photoelectric converter 201. For example, the selection portion 213a selectively allows the passage of only the light passing through one region (a left region in FIG. 1) among two pupil regions symmetrical to each other with respect to the center of the imaging lens IL in the exit pupil of the imaging lens IL.

The plurality of selection portions 213a and the plurality of opening portions 213c correspond to one micro lens group G1. The plurality of selection portions 213a corresponding to the micro lens group G1 selectively allow the passage of only the light passing through the same region of a partial pupil region in the exit pupil of the imaging lens IL.

The light shielding portion 213b is disposed to correspond to a part of the micro lenses ML among the micro lenses ML included in the micro lens group G1.

Specifically, when the second substrate 20 is viewed in a plane, the light shielding portion 213b is disposed to correspond to at least a part of the micro lens ML disposed at the farthest end in a direction (a positional displacement direction) of the gravity center position P of the opening portion 213c with respect to the center position C of the micro lens ML corresponding to the selection portion 213a. In the description below, the direction of the gravity center position P of the opening portion 213c with respect to the center position C of the micro lens ML corresponding to the selection portion 213a will be referred to as a direction of the gravity center position P of the opening portion 213c. In FIG. 1, the light shielding portion 213b is disposed to correspond to the micro lens ML disposed at the right end among the micro lenses ML included in the micro lens group G1. The light shielding portion 213b shields the entire light passing through the corresponding micro lens ML and transmitted through the second photoelectric converter 201.

It is desirable that the first wire 111 not be formed in a region where light passing through the opening portion 213c reaches, in the first wiring layer 110. In FIG. 1, when the second substrate 20 is viewed in a plane, the first wire 111 is formed so as not to overlap the opening portion 213c. For this reason, the light passing through the opening portion 213c is not interrupted by the first wire 111 and is easily incident to the first photoelectric converter 101.

Light passing through the same region of the exit pupil of the imaging lens IL and passing through each of the plurality of opening portions 213c corresponding to the micro lens group G1 is incident to the first photoelectric converter 101. Accordingly, the sensitivity of the first photoelectric converter 101 increases. Thus, focus detection accuracy is improved.

The first wire 111 is formed to correspond to a position where the light shielding portion 213b is disposed, in the first wiring layer 110. When an opening portion is formed in the light shielding portion 213b similarly to the selection portion 213a, there is a case where light passing through the opening portion is interrupted by the first wire 111 disposed near the light shielding portion 213b. In this case, a signal which is generated by the light passing through the opening portion and incident to the first photoelectric converter 101 is not appropriate and hence focus detection accuracy is deteriorated. An angle of the light which is incident to the first wiring layer 110 is dependent on a position of the opening portion, that is, a position of a region where the light passes in the exit pupil of the imaging lens IL. When the opening portion is formed in the light shielding portion 213b, the amount of the light passing through the opening portion and interrupted by the first wire 111 becomes different depending on the angle of the light. That is, the amount of the light passing through the opening portion and incident to the first photoelectric converter 101 becomes different depending on the angle of the light. For this reason, a variation in focus detection accuracy occurs.

In the embodiment, since light is shielded by the light shielding portion 213b, deterioration in focus detection accuracy can be suppressed.

Further, for example, even when the first substrate 10 is displaced to the left relative to the second substrate 20 as shown in FIG. 1 when the first substrate 10 and the second substrate 20 are laminated, a variation in light receiving amount of the first photoelectric converter 101 in accordance with the positional displacement can be suppressed by the light shielding portion 213b. For this reason, deterioration in focus detection accuracy can be suppressed. A case may be considered in which the first substrate 10 is displaced to the right relative to the second substrate 20. However, since light is incident to the first photoelectric converter 101 from a left side as shown in FIG. 1, there is a small influence caused by the rightward positional displacement.

Figure 2B:
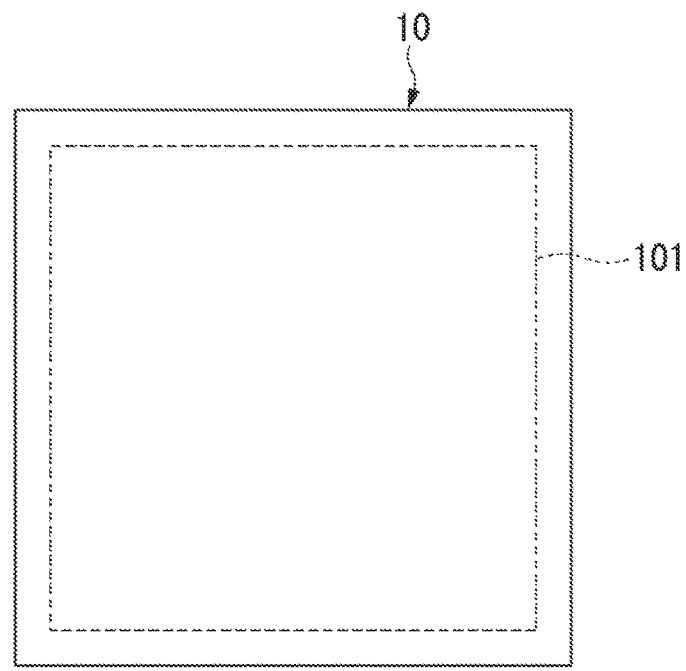
FIG. 2B is a top view showing a first substrate and a second substrate constituting the solid-state imaging device according to the first embodiment of the present invention.

FIGS. 2A and 2B show a state where the first substrate 10 and the second substrate 20 are viewed in a plane. FIG. 2A shows the second substrate 20 which is viewed in the perpendicular direction from the second face of the second semiconductor layer 200. FIG. 2A shows an array of the second photoelectric converter 201, the selection portion 213a, the opening portion 213c, and the light shielding portion 213b. FIG. 2B shows the first substrate 10 which is viewed in the perpendicular direction from the first face of the first wiring layer 110. FIG. 2B shows the first photoelectric converter 101.

The first photoelectric converter 101 is disposed to overlap the plurality of second photoelectric converters 201 disposed in a two-dimensional matrix shape. Although not shown in FIG. 2A, the plurality of micro lenses ML are two-dimensionally disposed when the second substrate 20 is viewed in a plane. The plurality of second photoelectric converters 201 are disposed to respectively correspond to the micro lenses ML included in the micro lens group G1. That is, each of the plurality of first photoelectric converters 101 is disposed to overlap the micro lens group G1.

The light shielding layer 213 includes a plurality of the selection portions 213a and a plurality of the light shielding portions 213b. The plurality of selection portions 213a and the plurality of light shielding portion 213b are disposed to respectively correspond to the plurality of second photoelectric converters 201. That is, the selection portions 213a and the light shielding portions 213b are disposed to respectively overlap the plurality of second photoelectric converters 201. The gravity center position P of the opening portion 213c formed in the selection portion 213a is displaced to the right relative to the center position C of the micro lens ML corresponding to the selection portion 213a. The light shielding portion 213b is disposed to correspond to the column of the micro lens ML disposed at the farthest end in the direction of the gravity center position P of the opening portion 213c relative to the center position C of the micro lens ML corresponding to the selection portion 213a, that is, the right direction in FIG. 2A.

In FIG. 2A, the light shielding portion 213b is disposed in the entire micro lens ML disposed at the farthest end in the right direction of FIG. 2A among the micro lenses ML included in the micro lens group G1. However, the selection portion 213a may be disposed to correspond to a part of the micro lens ML disposed at the farthest end in the right direction of FIG. 2A among the micro lenses ML included in the micro lens group G1. For example, when the first wire 111 is not disposed in a region corresponding to the micro lens ML disposed at the farthest end of the first wiring layer 110 in the right direction in FIG. 2A, the selection portion 213a may be disposed instead of the light shielding portion 213b.

The first substrate 10 and the second substrate 20 may be electrically connected to each other by a bump or the like. The first substrate 10 and the second substrate 20 may be connected to each other by a resin or the like. The light shielding layer 213 may be disposed in the first wiring layer 110 of the first substrate 10. Further, a light field signal may be obtained by using the configuration shown in FIG. 1.

The solid-state imaging device 1a shown in FIG. 1 includes two substrates provided with the photoelectric converter, but the solid-state imaging device 1a may include three or more substrates provided with the photoelectric converter.

The color filter CF, the configuration other than the light shielding layer 213 in the second wiring layer 210, and the first wiring layer 110 are not characteristic structures of the solid-state imaging device 1a. Further, such structures are not essential to obtain a characteristic effect of the solid-state imaging device 1a.

According to the embodiment, there is provided the solid-state imaging device 1a including: the first substrate 10 which includes the plurality of first photoelectric converters 101 arranged two-dimensionally; the second substrate 20 which includes the plurality of second photoelectric converters 201 arranged two-dimensionally and is laminated on the first substrate 10; the plurality of micro lenses ML which are disposed on the opposite face facing the imaging lens IL side among the faces of the second substrate 20 and form an image of light passing through the imaging lens IL; and the light shielding layer 213 which is disposed between the first photoelectric converter 101 and the second photoelectric converter 201 and includes the selection portion 213a provided with the opening portion 213c selectively allowing the passage of only the light passing through a partial region of the pupil region in the exit pupil of the imaging lens IL among the light passing through the micro lens ML and transmitted through the second photoelectric converter 201 and the light shielding portion 213b shielding the entire light passing through the micro lens ML and transmitted through the second photoelectric converter 201. Here, each of the plurality of first photoelectric converters 101 overlaps the micro lens group G1 including a plurality of micro lenses among the plurality of micro lenses ML when the face (the opposite face) of the imaging lens IL side among the faces of the second substrate 20 is viewed in the perpendicular direction (the normal direction), the selection portion 213a corresponding to the micro lens group G1 selectively allows the passage of only the light passing through the same region in a partial pupil region, and the light shielding portion 213b corresponding to the micro lens group G1 is disposed to correspond to at least a part of the micro lens ML disposed at the farthest end in the direction of the gravity center position P of the opening portion 213c with respect to the center position C of the micro lens ML corresponding to the selection portion 213a in the micro lens group G1.

In the embodiment, each of the plurality of first photoelectric converters 101 overlaps the micro lens group G1. Further, the selection portion 213a corresponding to the micro lens group G1 selectively allows the passage of only the light passing through a partial region of the pupil region in the exit pupil of the imaging lens IL. Further, the light shielding portion 213b corresponding to the micro lens group G1 is disposed to correspond to at least a part of the micro lens ML disposed at the farthest end in the direction of the gravity center position P of the opening portion 213c in the micro lens group G1. For this reason, focus detection accuracy can be improved.

In the embodiment, since the back side illumination type image sensor is used in the second substrate 20, the second substrate 20, that is, the second semiconductor layer 200 can be thinned. For this reason, light easily reaches the first substrate 10.

The amount of the light reaching the first substrate 10 is different in accordance with each color of the color filter CF. As a wavelength becomes shorter, the light cannot easily reach the first substrate 10. This is because an absorption coefficient for silicon forming the first substrate 10 and the second substrate 20 is different depending on the wavelength of the light. In the embodiment, since the first substrate 10 is formed as the front side illumination type image sensor, the first semiconductor layer 100 of the first substrate 10 can be thickened. For this reason, when light (for example, red light) having a long wavelength is transmitted through the color filter CF, the light can be easily converted into a signal.

In the embodiment, the light shielding layer 213 is disposed between the imaging lens IL side face (opposite face) and the first substrate 10 side face, in the second substrate 20. It is desirable that the positional displacement between the micro lens ML and the opening portion 213c be small. When the light shielding layer 213 is disposed in the first substrate 10, there is a possibility that a positional displacement may occur between the micro lens ML and the opening portion 213c due to the positional displacement between the first substrate 10 and the second substrate 20. Since the light shielding layer 213 is disposed in the second substrate 20, the positional displacement between the micro lens ML and the opening portion 213c becomes small. Thus, focus detection accuracy can be improved.

(Second Embodiment)

Next, a second embodiment of the present invention will be described. In the embodiment, a solid-state imaging device 1a shown in FIG. 1 is used.

Figure 3A:
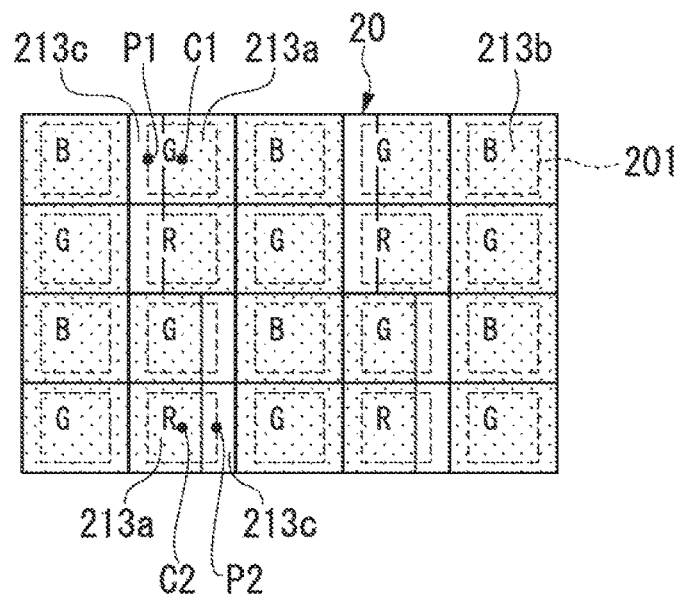
FIG. 3A is a top view showing a first substrate and a second substrate constituting a solid-state imaging device according to a second embodiment of the present invention.
Figure 3B:
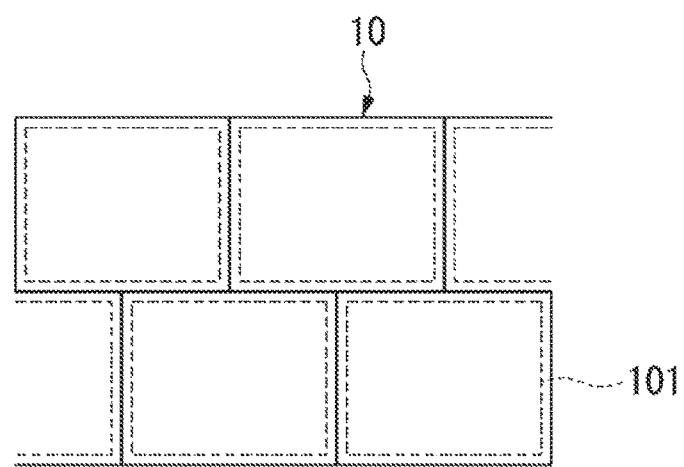
FIG. 3B is a top view showing a first substrate and a second substrate constituting the solid-state imaging device according to the second embodiment of the present invention.

FIGS. 3A and 3B show a state where a first substrate 10 and a second substrate 20 are viewed in a plane. FIG. 3A shows the second substrate 20 when viewed in the perpendicular direction from a second face of the second semiconductor layer 200. FIG. 3A shows an array of a second photoelectric converter 201, a selection portion 213a, an opening portion 213c, and a light shielding portion 213b. FIG. 3B shows the first substrate 10 when viewed in the perpendicular direction from a first face of a first wiring layer 110. FIG. 3B shows a first photoelectric converter 101.

In FIG. 3A, color filters CF corresponding to the selection portion 213a and the light shielding portion 213b are shown by any of "R", "G", and "B". "R" corresponds to the color filter CF of red (R). "G" corresponds to the color filter CF of green (G). "B" corresponds to the color filter CF of blue (B).

The plurality of color filters CF are disposed in a two-dimensional matrix shape. An array of the plurality of color filters CF is a Bayer array. In the Bayer array, a plurality of unit arrays each including one red filter CF, two green filters CF, and one blue filter CF are disposed. Further, in the Bayer array, a first column only having the green and blue filters CF and a second column only having the red and green filters CF are disposed alternately and repeatedly.

Although not shown in FIG. 3A, the micro lens group G1 is disposed to correspond to the first column only having the green and blue filters CF arranged in the array of the plurality of color filters CF and the second column only having the red and green filters CF in the array of the plurality of color filters CF. Specifically, the micro lens group G1 is disposed to correspond to two color filters CF of the first column and two color filters CF of the second column.

The plurality of first photoelectric converters 101 are respectively disposed to overlap the micro lens group G1. For this reason, each of the plurality of first photoelectric converters 101 is disposed to correspond to two color filters CF of the first column and two color filters CF of the second column.

The light shielding portion 213b corresponding to the micro lens group G1 is disposed to correspond to the micro lens ML corresponding to the first column in the micro lenses ML included in the micro lens group G1. That is, the light shielding portion 213b is disposed to correspond to the green filter CF and the blue filter CF.

As described above, the amount of the light reaching the first substrate 10 becomes different in accordance with each color of the color filter CF. Light which is transmitted through the red filter CF allowing the transmission of light having a large wavelength can easily reach the first substrate 10. However, light which is transmitted through the blue filter CF allowing the transmission of light having a short wavelength cannot easily reach the first substrate 10. Accordingly, the selection portion 213a corresponds to the second column having the red filter CF disposed therein and the light shielding portion 213b corresponds to the first column having the blue filter CF disposed therein so that a larger amount of light is incident to the first photoelectric converter 101.

The light shielding layer 213 includes a plurality of the selection portions 213a and a plurality of the light shielding portions 213b. The plurality of selection portions 213a includes the selection portion 213a (a first selection portion) in which a direction of a gravity center position P1 of the opening portion 213c with respect to a center position C of a micro lens ML1 is a first direction and the selection portion 213a (the second selection portion) in which a direction of the gravity center position P1 of the opening portion 213c with respect to a center position C of a micro lens ML2 is a second direction opposite to the first direction. In the embodiment, the first direction will be set as a left direction in FIG. 3A and the second direction will be set as a right direction in FIG. 3A.

The first selection portion and the second selection portion selectively allow the passage of only the light passing through different regions of the pupil region in an exit pupil of an imaging lens IL. The first selection portion selectively allows the passage of only the light passing through a right region of two pupil regions symmetrical to each other with respect to a center of the imaging lens IL in the exit pupil of the imaging lens IL. The second selection portion selectively allows the passage of only the light passing through a left region of two pupil regions symmetrical to each other with respect to the center of the imaging lens IL in the exit pupil of the imaging lens IL.

Only the first selection portion of the first selection portion and the second selection portion corresponds to a first row of the array of the plurality of color filters CF. In FIG. 3A, the first selection portion is disposed to correspond to only two upper rows in the array of four rows of the plurality of color filters CF. Further, only the second selection portion of the first selection portion and the second selection portion corresponds to a second row different from the first row of the array of the plurality of color filters CF. In FIG. 3A, the second selection portion is disposed to correspond to two lower rows of the array of four rows of the plurality of color filters CF. That is, only one of the first selection portion and the second selection portion corresponds to the same row of the array of the plurality of color filters CF.

The micro lens group G1 corresponding to the first selection portion and the light shielding portion 213b corresponding to the same micro lens group G1 are disposed at the left side of the first selection portion. Further, the micro lens group G1 corresponding to the second selection portion and the light shielding portion 213b corresponding to the same micro lens group G1 are disposed at the right side of the second selection portion.

In the embodiment, each of the plurality of first photoelectric converters 101 overlaps the micro lens group G1. Further, the selection portion 213a corresponding to the micro lens group G1 selectively allows the passage of only the light passing through a partial region of the pupil region in the exit pupil of the imaging lens IL. Further, the light shielding portion 213b corresponding to the micro lens group G1 is disposed to correspond to at least a part of the micro lens ML disposed at the farthest end of the micro lens group G1 in the direction of the gravity center positions P1 and P2 of the opening portion 213c. For this reason, focus detection accuracy can be improved.

In the embodiment, the selection portion 213a corresponds to the second column having the red filter CF disposed therein and the light shielding portion 213b corresponds to the first column having the blue filter CF disposed therein. For this reason, a large amount of light is incident to the first photoelectric converter 101. Thus, focus detection accuracy is improved.

In the embodiment, only one of the first selection portion and the second selection portion corresponds to the same row of the array of the plurality of color filters CF. For this reason, the arrangement pitch of the first photoelectric converter 101 corresponding to the first selection portion and the arrangement pitch of the first photoelectric converter 101 corresponding to the second selection portion are narrowed compared with the case where the first photoelectric converter 101 corresponding to the first selection portion and the first photoelectric converter 101 corresponding to the second selection portion are alternately disposed in the row direction of the array of the plurality of color filters CF. Thus, since a spatial resolution of a phase difference is improved, focus detection accuracy is improved.

(Third Embodiment)

Figure 4:
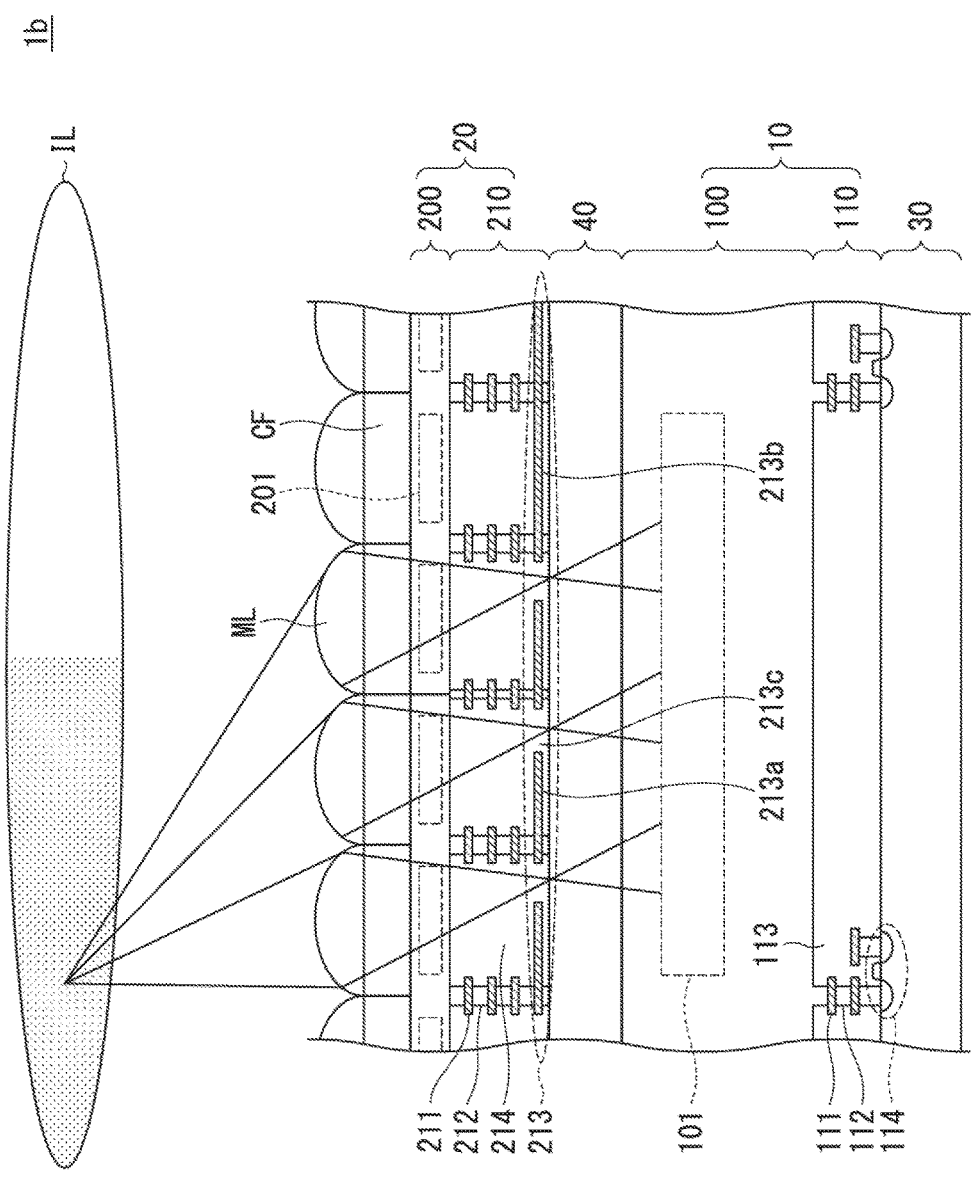
FIG. 4 is a cross-sectional view showing a configuration of a solid-state imaging device according to a third embodiment of the present invention.

Next, a third embodiment of the present invention will be described. FIG. 4 shows a configuration of a solid-state imaging device 1b according to the embodiment. FIG. 4 shows a cross-section of the solid-state imaging device 1b. As shown in FIG. 4, the solid-state imaging device 1b includes a first substrate 10, a second substrate 20 which is laminated on the first substrate 10, a micro lens ML which is formed on a front face of the second substrate 20, a color filter CF, a third substrate 30 (a support substrate), and a resin layer 40.

Among the first substrate 10 and the second substrate 20, a first semiconductor layer 100 of the first substrate 10 and a second wiring layer 210 of the second substrate 20 face each other. In the embodiment, the first substrate 10 constitutes a back side illumination type image sensor. The first semiconductor layer 100 includes a first face which faces the first wiring layer 110 and a second face which is opposite to the first face and faces the resin layer 40. The first wiring layer 110 includes a first face which faces the third substrate 30 and a second face which is opposite to the first face and faces the first semiconductor layer 100. The third substrate 30 is formed of a material including a semiconductor such as silicon (Si).

A MOS transistor 114 includes a source region and a drain region which are diffusion regions formed in the third substrate 30 and a gate electrode which is formed in the first wiring layer 110. The other points for the first substrate 10 are similar to those of the solid-state imaging device 1a shown in FIG. 1.

A resin layer 40 which bonds the first substrate 10 and the second substrate 20 to each other is disposed between the first substrate 10 and the second substrate 20. The resin layer 40 is formed of a resin such as epoxy resin. Due to the resin layer 40, the bonding strength between the first substrate 10 and the second substrate 20 increases.

The second substrate 20 is similar to that of the solid-state imaging device 1a shown in FIG. 1. The first substrate 10 and the second substrate 20 are electrically connected to each other by a penetration electrode not shown in FIG. 4.

A planar structure of each of the first substrate 10 and the second substrate 20 may be any one of the structure shown in FIGS. 2A and 2B and the structure shown in FIGS. 3A and 3B.

In the embodiment, each of the plurality of first photoelectric converters 101 overlaps the micro lens group G1. Further, the selection portion 213a corresponding to the micro lens group G1 selectively allows the passage of only the light passing through a partial region of a pupil region in an exit pupil of an imaging lens IL. Further, the light shielding portion 213b corresponding to the micro lens group G1 may be disposed to correspond to at least a part of the micro lens ML disposed at the farthest end of the micro lens group G1 in the direction of the gravity center position of the opening portion 213c. For this reason, focus detection accuracy can be improved.

In the embodiment, the back side illumination type image sensor is used in the first substrate 10 and the second substrate 20. Further, a thickness of the first photoelectric converter 101 is larger than a thickness of the second photoelectric converter 201 in the lamination direction of the first substrate 10 and the second substrate 20.

Since the back side illumination type image sensor is used in the second substrate 20, the second substrate 20, that is, a second semiconductor layer 200 can be thinned. For this reason, light easily reaches the first substrate 10.

Since the back side illumination type image sensor is used in the first substrate 10, the first photoelectric converter 101 can be disposed near the micro lens ML compared with the solid-state imaging device 1a shown in FIG. 1. For this reason, it is possible to suppress the attenuation of the light incident to the first photoelectric converter 101. The resin layer 40 can be thinner than the first wiring layer 110. The resin layer 40 may not be disposed in the solid-state imaging device 1b.

Since the thickness of the first photoelectric converter 101 is larger than the thickness of the second photoelectric converter 201 in the lamination direction of the first substrate 10 and the second substrate 20, light which cannot be absorbed by the second substrate 20 and has a color of a wavelength longer than those of the other colors can be easily converted into a signal in the first substrate 10.

(Fourth Embodiment)

Next, a fourth embodiment of the present invention will be described. In the embodiment, a solid-state imaging device 1a shown in FIG. 1 is used.

Figure 5A:
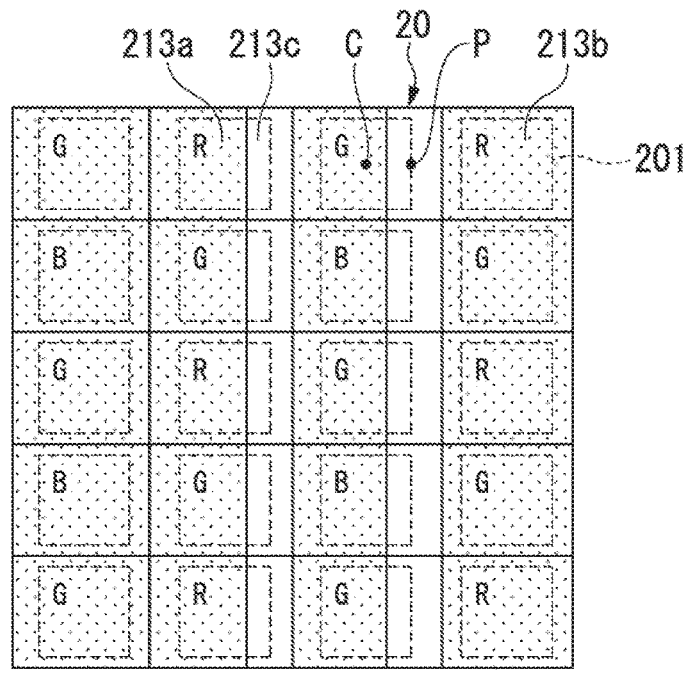
FIG. 5A is a top view showing a first substrate and a second substrate constituting a solid-state imaging device according to a fourth embodiment of the present invention.
Figure 5B:
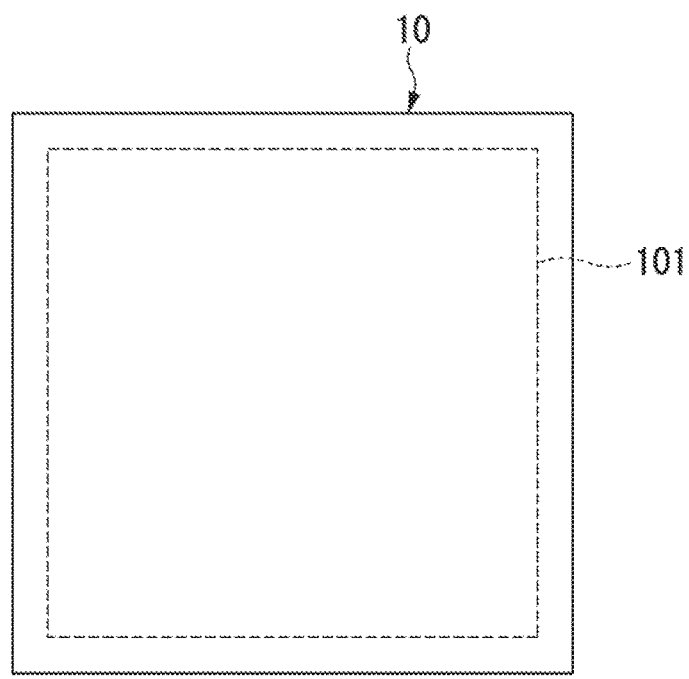
FIG. 5B is a top view showing a first substrate and a second substrate constituting the solid-state imaging device according to the fourth embodiment of the present invention.

FIG. 5 shows a state where a first substrate 10 and a second substrate 20 are viewed in a plane. FIG. 5A shows the second substrate 20 which is viewed in the perpendicular direction from a second face of a second semiconductor layer 200. FIG. 5A shows an array of a second photoelectric converter 201, a selection portion 213a, an opening portion 213c, and a light shielding portion 213b. FIG. 5B shows the first substrate 10 which is viewed in the perpendicular direction from a first face of a first wiring layer 110. FIG. 5B shows the first photoelectric converter 101.

In FIG. 5A, color filters CF corresponding to the selection portion 213a and the light shielding portion 213b are shown by any of "R", "G", and "B". "R" corresponds to the color filter CF of red (R). "G" corresponds to the color filter CF of green (G). "B" corresponds to the color filter CF of blue (B).

The plurality of color filters CF are disposed in a two-dimensional matrix shape. An array of the plurality of color filters CF is a Bayer array.

In FIG. 5A, a direction of a gravity center position P of the opening portion 213c with respect to a center position C of a micro lens ML corresponding to the selection portion 213a is a right direction. In the direction of the gravity center position P of the opening portion 213c, a period of the array of the plurality of color filters CF includes n (n: an even number equal to or larger than 2) columns. In the case of the Bayer array, n is 2. The array of the color filters CF may not be the Bayer array.

A micro lens group G1 includes the micro lenses ML disposed in n×m (m: a natural number equal to or larger than 2) columns arranged in the direction of the gravity center position P of the opening portion 213c. Although not shown in FIG. 5A, the micro lens group G1 includes the micro lenses ML disposed in four columns (two columns×two columns) arranged in the direction of the gravity center position P of the opening portion 213c. In this case, m is 2.

The light shielding portion 213b corresponding to the micro lens group G1 is disposed to correspond to the micro lenses ML disposed in an area from the column of the farthest end to the (n/2)-th column in the direction of the gravity center position P of the opening portion 213c among the micro lenses ML included in the micro lens group G1 and the micro lenses ML disposed in an area from the column of the farthest end to the (n/2)-th column in the opposite direction to the direction of the gravity center position P of the opening portion 213c among the micro lenses ML included in the micro lens group G1. The micro lenses ML disposed in the area from the column of the farthest end to the (n/2)-th column include the micro lenses ML disposed in the column of the farthest end and disposed in the continuous area to the (n/2)-th column.

In FIG. 5A, the opposite direction to the direction of the gravity center position P of the opening portion 213c is a left direction. Further, n is 2. The light shielding portion 213b corresponding to the micro lens group G1 is disposed to correspond to the micro lenses ML disposed in one column of the farthest end in the right direction of FIG. 5A and the micro lenses ML disposed in one column of the farthest end in the left direction corresponding to the opposite direction of FIG. 5A among the micro lenses ML included in the micro lens group G1.

Each of the plurality of color filters CF is disposed to correspond to the micro lens ML. For this reason, a correlation between the light shielding portion 213b and the color filter CF is similar to a correlation between the light shielding portion 213b and the micro lens ML.

In the embodiment, the solid-state imaging device 1b shown in FIG. 4 may be used.

In the embodiment, each of the plurality of first photoelectric converters 101 overlaps the micro lens group G1. Further, the selection portion 213a corresponding to the micro lens group G1 selectively allows the passage of only the light passing through a partial region of a pupil region in an exit pupil of an imaging lens IL. Further, the light shielding portion 213b corresponding to the micro lens group G1 is disposed to correspond to at least a part of the micro lens ML disposed at the farthest end in the direction of the gravity center position P of the opening portion 213c in the micro lens group G1. For this reason, focus detection accuracy can be improved.

In the embodiment, in the array of the color filters CF corresponding to the micro lens group G1, the color filter CF disposed at a position corresponding to the selection portion 213a includes n×(m−1) columns. That is, the color filter CF disposed at a position corresponding to the selection portion 213a includes a column which is an integer times the period n of the array of the plurality of color filters CF. For this reason, the light transmitted through all types of color filters CF constituting the array of the plurality of color filters CF is incident to the first photoelectric converter 101. Thus, it is possible to realize focus detection regardless of the color of a subject.

(Fifth Embodiment)

Next, a fifth embodiment of the present invention will be described. In the embodiment, a solid-state imaging device 1a shown in FIG. 1 is used.

Figure 6A:
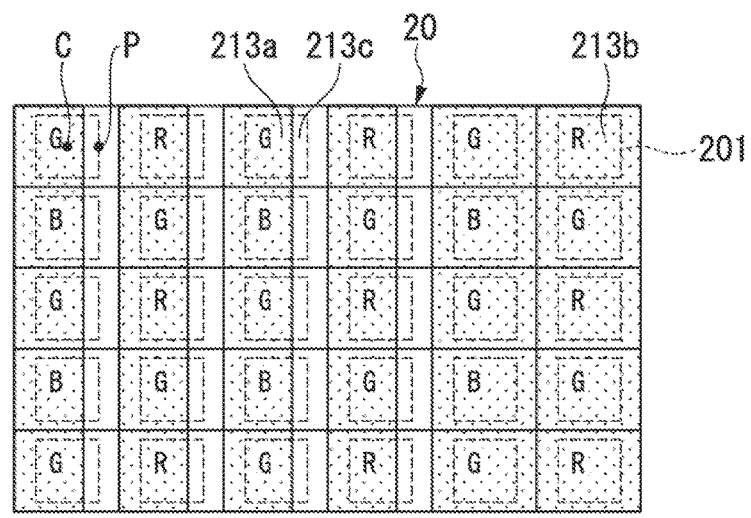
FIG. 6A is a top view showing a first substrate and a second substrate constituting a solid-state imaging device according to a fifth embodiment of the present invention.
Figure 6B:
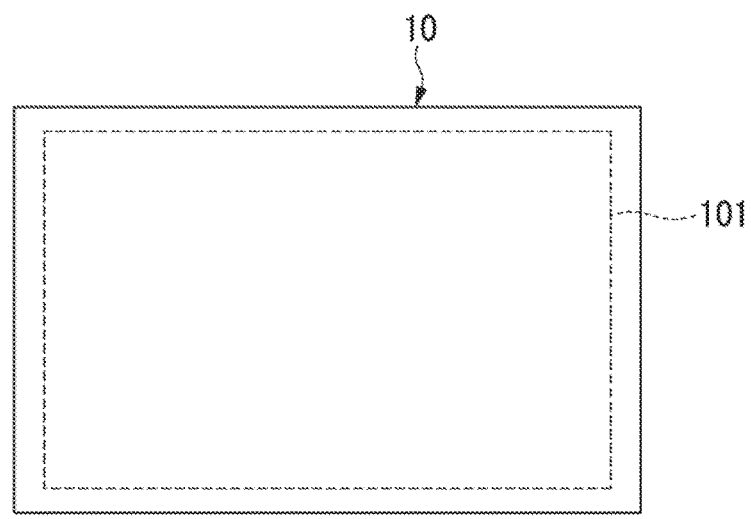
FIG. 6B is a top view showing a first substrate and a second substrate constituting the solid-state imaging device according to the fifth embodiment of the present invention.

FIG. 6 shows a state where a first substrate 10 and a second substrate 20 are viewed in a plane. FIG. 6A shows the second substrate 20 when viewed in the perpendicular direction from a second face of a second semiconductor layer 200. FIG. 6A shows an array of a second photoelectric converter 201, a selection portion 213a, an opening portion 213c, and a light shielding portion 213b. FIG. 6B shows the first substrate 10 when viewed in the perpendicular direction from a first face of a first wiring layer 110. FIG. 6B shows the first photoelectric converter 101.

In FIG. 6A, color filters CF corresponding to the selection portion 213a and the light shielding portion 213b are shown by any of "R", "G", and "B". "R" corresponds to the color filter CF of red (R). "G" corresponds to the color filter CF of green (G). "B" corresponds to the color filter CF of blue (B).

The plurality of color filters CF are disposed in a two-dimensional matrix shape. An array of the plurality of color filters CF is a Bayer array.

In FIG. 6A, a direction of a gravity center position P of the opening portion 213c with respect to a center position C of a micro lens ML corresponding to the selection portion 213a is a right direction. A period of the array of the color filters CF in the direction of the gravity center position P of the opening portion 213c includes r (r: a natural number equal to or larger than 1) columns. In the case of the Bayer array, r is 2. The array of the color filters CF may not be the Bayer array.

A micro lens group G1 includes the micro lenses ML disposed in r×s (s: a natural number equal to or larger than 2) columns arranged in the direction of the gravity center position P of the opening portion 213c. Although not shown in FIG. 6A, the micro lens group G1 includes the micro lenses ML disposed in six columns (two columns×three columns) arranged in the direction of the gravity center position P of the opening portion 213c. In this case, s is 3.

The light shielding portion 213b corresponding to the micro lens group G1 is disposed to correspond to only the micro lenses ML disposed in an area from the column of the farthest end to a (r×t)-th (t: a natural number equal to or larger than 1, s>t) column in the direction of the gravity center position P of the opening portion 213c among the micro lenses ML included in the micro lens group G1. The micro lenses ML disposed in an area from the column of the farthest end to the (r×t)-th column include the micro lenses ML disposed in the column of the farthest end and the micro lenses ML disposed in a continuous area to the (r×t)-th column.

In FIG. 6A, a direction of the gravity center position P of the opening portion 213c is a right direction. Further, r is 2 and s is 3. The light shielding portion 213b corresponding to the micro lens group G1 is disposed to correspond to the micro lenses ML disposed in an area from the column of the farthest end to a second column (two columns×one column) in the right direction of FIG. 6A among the micro lenses ML included in the micro lens group G1. In this case, t is 1.

Each of the plurality of color filters CF is disposed to correspond to the micro lens ML. For this reason, a correlation between the light shielding portion 213b and the color filter CF is similar to a correlation between the light shielding portion 213b and the micro lens ML.

In the embodiment, the solid-state imaging device 1b shown in FIG. 4 may be used.

In the embodiment, each of the plurality of first photoelectric converters 101 overlaps the micro lens group G1. Further, the selection portion 213a corresponding to the micro lens group G1 selectively allows the passage of only the light passing through a partial region of a pupil region in an exit pupil of an imaging lens IL. Further, the light shielding portion 213b corresponding to the micro lens group G1 is disposed to correspond to at least a part of the micro lens ML disposed at the farthest end in the direction of the gravity center position P of the opening portion 213c in the micro lens group G1. For this reason, focus detection accuracy can be improved.

In the embodiment, the color filter CF disposed at a position corresponding to the selection portion 213a in the array of the color filters CF corresponding to the micro lens group G1 includes r×t columns. That is, the color filter CF disposed at a position corresponding to the selection portion 213a includes a column which is an integer times the period r of the array of the plurality of color filters CF. For this reason, light transmitted through all types of color filters CF constituting the array of the plurality of color filters CF is incident to the first photoelectric converter 101. Thus, it is possible to realize focus detection regardless of the color of a subject.

(Sixth Embodiment)

Figure 7:
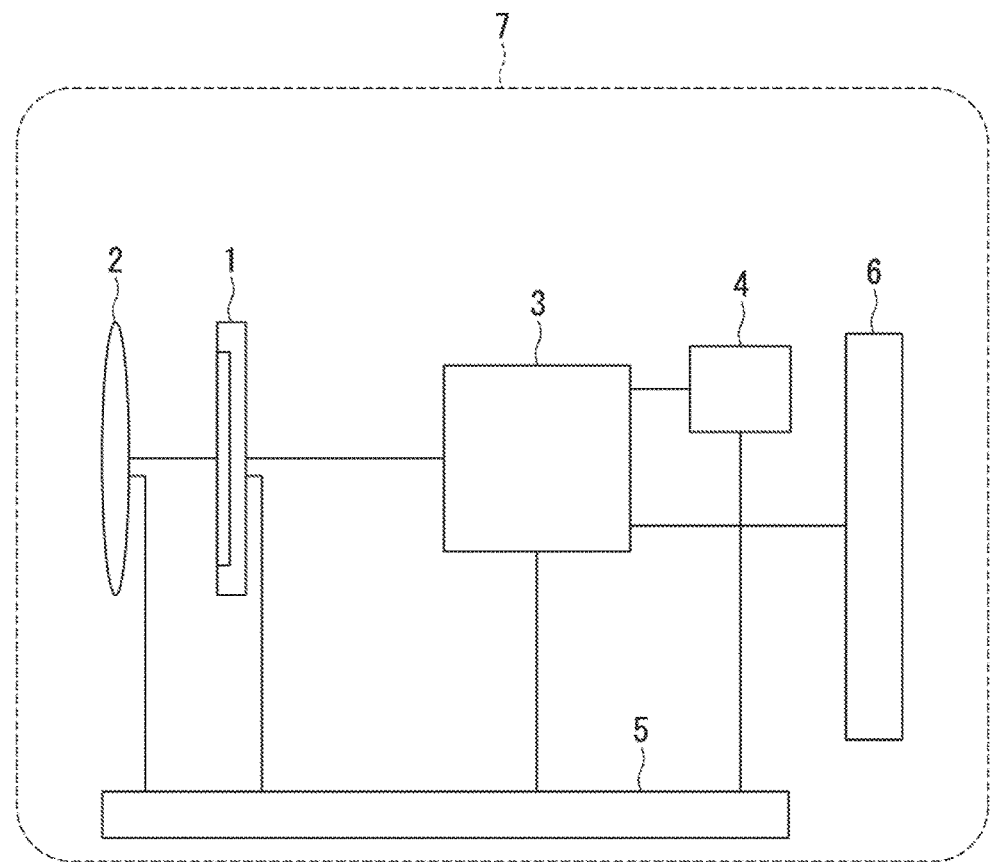
FIG. 7 is a block diagram showing a configuration of an imaging apparatus according to a sixth embodiment of the present invention.

Next, a sixth embodiment of the present invention will be described. In the embodiment, an imaging apparatus equipped with the solid-state imaging device according to any one of the first to fifth embodiments will be described. FIG. 7 shows a configuration of an imaging apparatus 7 according to the embodiment. The imaging apparatus 7 according to the embodiment may be an electronic device having an imaging function and may be a digital video camera or an endoscope other than a digital camera.

As shown in FIG. 7, the imaging apparatus 7 includes a solid-state imaging device 1, a lens unit 2, an image signal processing device 3, a recording device 4, a camera control device 5, and a display device 6.

The lens unit 2 forms an image on the solid-state imaging device 1 by the use of light from a subject while zooming, focusing, or an aperture is controlled by the camera control device 5. By the control of the camera control device 5, the solid-state imaging device 1 converts light incident to the solid-state imaging device 1 through the lens unit 2 into an electrical signal and outputs an imaging signal and a focus detection signal obtained depending on the incident light amount to the image signal processing device 3.

The image signal processing device 3 performs a signal amplification process, an image data conversion process, and various correction processes on the imaging signal input from the solid-state imaging device 1 and then performs an image data compression process or the like. Further, the image signal processing device 3 calculates a focal point by performing a calculation based on a phase difference detection method using the focus detection signal input from the solid-state imaging device 1. The solid-state imaging device 1 may calculate the focal point. The image signal processing device 3 uses a memory (not shown) as a temporary storage unit for the image data used in each process.

The recording device 4 is a removable recording medium such as a semiconductor memory and is used to record or read the image data. The display device 6 is a display device such as a liquid crystal display that displays an image thereon on the basis of the image data processed by the image signal processing device 3 or the image data read out from recording device 4. The camera control device 5 is a control device that controls the entire imaging device 7.

According to this embodiment, the imaging apparatus 7 including the solid-state imaging device 1 according to any one of the first to fifth embodiments is obtained.

In this embodiment, focus detection accuracy can be improved similarly to the first to fifth embodiments.

As used herein, the following directional terms "forward, rearward, above, downward, right, left, vertical, horizontal, below, transverse, row and column" as well as any other similar directional terms refer to those directions of a device equipped with the present invention. Accordingly, these terms, as utilized to describe the present invention should be interpreted relative to a device equipped with the present invention.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed:

1. A solid-state imaging device comprising:
a first substrate which includes a plurality of first photoelectric converters arranged two-dimensionally;
a second substrate which includes a plurality of second photoelectric converters arranged two-dimensionally and is laminated on the first substrate;
a plurality of micro lenses which are disposed on an opposite face facing an imaging lens among faces of the second substrate and form an image of light passing through the imaging lens; and
a light shielding layer which is disposed between the first photoelectric converter and the second photoelectric converter, the light shielding layer including:
a selection portion provided with an opening portion at a part of a light shielding material, the opening portion being configured to selectively allow passage of only light passing through a partial region of a pupil region in an exit pupil of the imaging lens among light passing through the micro lens and transmitted through the second photoelectric converter; and
a light shielding portion configured to shield an entire light passing through the micro lens and transmitted through the second photoelectric converter, wherein
each of the plurality of first photoelectric converters overlaps a micro lens group including a plurality of micro lenses among the plurality of micro lenses when the opposite face of the second substrate is viewed in a normal direction,
either the selection portion or the light shielding portion is disposed corresponding to each micro lens of the micro lens group,
the selection portion corresponding to the micro lens group selectively allows passage of only light passing through the same region in a part of the pupil region, and
the light shielding portion corresponding to the micro lens group is disposed to correspond to at least one of the micro lenses disposed at a farthest end in a direction of a gravity center position of the opening portion formed on the selection portion relative to a center position of the micro lens corresponding to the selection portion among the micro lenses included in the micro lens group.

2. The solid-state imaging device according to claim 1, wherein
the light shielding portion corresponding to the micro lens group is disposed to correspond to the entire micro lens disposed at the farthest end in the positional displacement direction among the micro lenses included in the micro lens group.

3. The solid-state imaging device according to claim 1, wherein
a plurality of color filters arranged two-dimensionally are disposed between the plurality of micro lenses and the plurality of second photoelectric converters,
each of the plurality of color filters is disposed to correspond to the micro lens,
an array of the plurality of color filters is a Bayer array,
the micro lens group is disposed to correspond to a first column having only the green and blue filters disposed in the array of the plurality of color filters and a second column having only the red and green filters disposed in the array of the plurality of color filters, and
the light shielding portion corresponding to the micro lens group is disposed to correspond to the micro lens corresponding to the first column among the micro lenses included in the micro lens group.

4. The solid-state imaging device according to claim 3, wherein
the light shielding layer includes a plurality of the selection portions,
the plurality of selection portions include a first selection portion in which the direction of the gravity center position of the opening portion with respect to the center position of the micro lens is a first direction and a second selection portion in which the direction of the gravity center position of the opening portion with respect to the center position of the micro lens is a second direction opposite to the first direction,
only the first selection portion among the first and second selection portions corresponds to a first row of the array of the plurality of color filters, and
only the second selection portion among the first and second selection portions corresponds to a second row different from the first row in the array of the plurality of color filters.

5. The solid-state imaging device according to claim 1, wherein
a plurality of color filters arranged two-dimensionally are disposed between the plurality of micro lenses and the plurality of first photoelectric converters,
each of the plurality of color filters is disposed to correspond to the micro lens,
a period in the positional displacement direction of the array of the plurality of color filters includes n columns, where n is an even number equal to or larger than 2,
the micro lens group includes the micro lenses disposed in n×m columns arranged in the positional displacement direction, where m is a natural number equal to or larger than 2, and
the light shielding portion corresponding to the micro lens group is disposed to correspond to the micro lenses disposed in an area from the column of a farthest end to a (n/2)-th column in the positional displacement direction and the micro lenses disposed in an area from the column of a farthest end to a (n/2)-th column in the opposite direction to the positional displacement direction among the micro lenses included in the micro lens group.

6. The solid-state imaging device according to claim 1, wherein
a plurality of color filters arranged two-dimensionally are disposed between the plurality of micro lenses and the plurality of first photoelectric converters,
each of the plurality of color filters is disposed to correspond to the micro lens,
a period in the positional displacement direction of the array of the color filters includes r columns, where r is a natural number equal to or larger than 1,
the micro lens group includes the micro lenses disposed in r×s columns arranged in the positional displacement direction, where s is a natural number equal to or larger than 2, and
the light shielding portion corresponding to the micro lens group is disposed to correspond only to the micro lenses disposed in an area from the column of a farthest end to a (r×t)-th column in the positional displacement direction among the micro lenses included in the micro lens group, where t is a natural number equal to or larger than 1, and s>t is satisfied.

7. The solid-state imaging device according to claim 1, wherein a back side illumination type image sensor is used in the second substrate and a front side illumination type image sensor is used in the first substrate.

8. The solid-state imaging device according to claim 1, wherein
a back side illumination type image sensor is used in the first substrate and the second substrate, and
a thickness of the first photoelectric converter is larger than a thickness of the second photoelectric converter in a lamination direction for the first substrate and the second substrate.

9. The solid-state imaging device according to claim 1, wherein
the light shielding layer is disposed between a face of the first substrate side and the opposite face, in the second substrate.

10. An imaging apparatus comprising:
the solid-state imaging device according to claim 1.

* * * * *